United States Patent
Venkatasubramanian et al.

(10) Patent No.: US 11,842,897 B2
(45) Date of Patent: Dec. 12, 2023

(54) HIGH DENSITY CARBON FILMS FOR PATTERNING APPLICATIONS

(71) Applicant: Applied Materials, Inc., Santa Clara, CA (US)

(72) Inventors: Eswaranand Venkatasubramanian, Santa Clara, CA (US); Samuel E. Gottheim, Santa Clara, CA (US); Pramit Manna, Santa Clara, CA (US); Abhijit Basu Mallick, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 465 days.

(21) Appl. No.: 16/593,757

(22) Filed: Oct. 4, 2019

(65) Prior Publication Data

US 2020/0135466 A1    Apr. 30, 2020

Related U.S. Application Data

(60) Provisional application No. 62/751,213, filed on Oct. 26, 2018.

(51) Int. Cl.
*H01L 21/033* (2006.01)
*H01L 21/683* (2006.01)
(Continued)

(52) U.S. Cl.
CPC ........ *H01L 21/0337* (2013.01); *C23C 16/272* (2013.01); *C23C 16/509* (2013.01);
(Continued)

(58) Field of Classification Search
CPC . C23C 16/509; C23C 16/272; H01L 21/2337; H01L 21/6833; H01L 21/0332;
(Continued)

(56) References Cited

U.S. PATENT DOCUMENTS 5,316,795 A * 5/1994 Patterson ................ C23C 16/27
                                                                423/446
5,684,669 A * 11/1997 Collins ............... H01L 21/6831
                                                                361/234
(Continued)

FOREIGN PATENT DOCUMENTS

CN        102016113 A     4/2011
KR    20120121340 A     11/2012
(Continued)

OTHER PUBLICATIONS

Taiwan Office Action for Application No. 108137197 dated May 25, 2023.

*Primary Examiner* — Jay C Chang
(74) *Attorney, Agent, or Firm* — Patterson + Sheridan, LLP

(57) ABSTRACT

Embodiments of the present disclosure generally relate to deposition of high transparency, high-density carbon films for patterning applications. In one embodiment, a method of forming a carbon film on a substrate is provided. The method includes flowing a hydrocarbon-containing gas mixture into a process chamber having a substrate positioned on an electrostatic chuck, wherein the substrate is maintained at a temperature of about −10° C. to about 20° C. and a chamber pressure of about 0.5 mTorr to about 10 Torr, and generating a plasma by applying a first RF bias to the electrostatic chuck to deposit a diamond-like carbon film containing about 60% or greater hybridized $sp^3$ atoms on the substrate, wherein the first RF bias is provided at a power of about 1800 Watts to about 2200 Watts and at a frequency of about 40 MHz to about 162 MHz.

20 Claims, 6 Drawing Sheets

(51) Int. Cl.
*H01L 21/311* (2006.01)
*H01L 21/027* (2006.01)
*H01L 21/67* (2006.01)
*H01J 37/32* (2006.01)
*C23C 16/509* (2006.01)
*C23C 16/27* (2006.01)

(52) U.S. Cl.
CPC .... *H01J 37/32724* (2013.01); *H01L 21/0332* (2013.01); *H01L 21/6833* (2013.01); *H01J 37/3244* (2013.01); *H01J 37/32082* (2013.01); *H01J 37/32834* (2013.01); *H01J 2237/1825* (2013.01); *H01J 2237/24585* (2013.01); *H01J 2237/3321* (2013.01); *H01L 21/0273* (2013.01); *H01L 21/31105* (2013.01); *H01L 21/31144* (2013.01); *H01L 21/67248* (2013.01)

(58) Field of Classification Search
CPC ......... H01L 37/32724; H01L 37/32834; H01L 37/32844; H01L 2237/24585; H01L 21/31105; H01L 21/0337; H01L 21/0273; H01L 21/31144; H01L 2237/3321; H01L 21/32244; H01J 2237/3321; H01J 37/322724; H01J 37/32082; H01J 2234/3321
See application file for complete search history.

(56) References Cited

U.S. PATENT DOCUMENTS

| | | | |
|---|---|---|---|
| 6,149,730 A * | 11/2000 | Matsubara | C23C 16/4405 118/728 |
| 6,291,334 B1 * | 9/2001 | Somekh | H01L 21/7681 257/E21.579 |
| 6,332,961 B1 * | 12/2001 | Johnson | H01J 37/32174 204/192.12 |
| 6,596,465 B1 * | 7/2003 | Mangat | B82Y 10/00 430/311 |
| 8,361,906 B2 | 1/2013 | Lee et al. | |
| 10,249,495 B2 | 4/2019 | Yang et al. | |
| 2003/0107865 A1 * | 6/2003 | Masuda | H01L 21/6833 361/234 |
| 2005/0130620 A1 * | 6/2005 | Fischer | H01J 37/32082 455/333 |
| 2009/0212010 A1 | 8/2009 | Wang et al. | |
| 2009/0246243 A1 * | 10/2009 | Martinu | C23C 28/042 424/423 |
| 2010/0211180 A1 * | 8/2010 | Helmuth | C23C 30/00 623/23.5 |
| 2012/0276743 A1 | 11/2012 | Won et al. | |
| 2014/0170853 A1 | 6/2014 | Shamma et al. | |
| 2014/0224427 A1 * | 8/2014 | Takahashi | H01J 37/32082 156/345.51 |
| 2015/0099069 A1 * | 4/2015 | Taylor | C23C 16/50 427/488 |
| 2015/0371851 A1 * | 12/2015 | Lee | H01J 37/32091 438/694 |
| 2017/0103893 A1 | 4/2017 | Kulshreshtha et al. | |
| 2017/0117174 A1 * | 4/2017 | Weichart | H01L 21/6831 |
| 2018/0358222 A1 | 12/2018 | Venkatasubramanian et al. | |
| 2019/0057862 A1 | 2/2019 | Yang et al. | |
| 2020/0126837 A1 * | 4/2020 | Kuno | H01L 21/67098 |
| 2022/0042168 A1 * | 2/2022 | Abraham | H01J 37/3464 |

FOREIGN PATENT DOCUMENTS

| | | |
|---|---|---|
| TW | 468209 B | 12/2001 |
| TW | 495553 B | 7/2002 |
| TW | 201309836 A | 3/2013 |
| TW | 201438062 A | 10/2014 |
| TW | 201809339 A | 3/2018 |
| WO | 2009006179 A1 | 1/2009 |
| WO | 2018004973 A1 | 1/2018 |
| WO | 2018175182 A1 | 9/2018 |
| WO | 2019/199681 A1 | 10/2019 |

\* cited by examiner

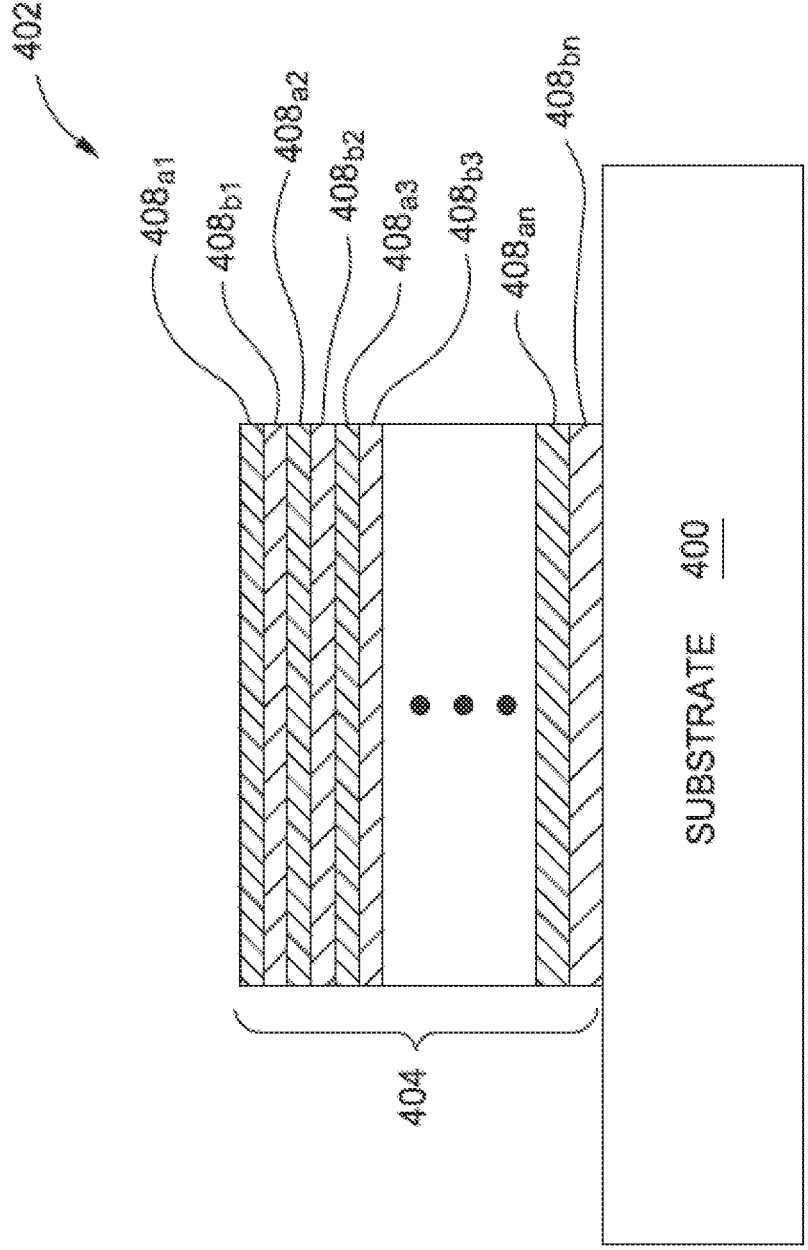

HIGH DENSITY CARBON FILMS FOR PATTERNING APPLICATIONS

CROSS-REFERENCE TO RELATED APPLICATIONS

This application claims priority to U.S. Provisional Patent Application No. 62/751,213, filed Oct. 26, 2018, which is herein incorporated by reference in its entirety.

BACKGROUND

Field

Embodiments of the present disclosure generally relate to the fabrication of integrated circuits. More particularly, the embodiments described herein provide techniques for deposition of high-density carbon films for patterning applications.

Description of the Related Art

Integrated circuits have evolved into complex devices that can include millions of transistors, capacitors and resistors on a single chip. The evolution of chip designs continually requires faster circuitry and greater circuit density. The demands for faster circuits with greater circuit densities impose corresponding demands on the process sequences used in the manufacture of integrated circuit components. For example, in process sequences that use conventional photolithographic techniques, a layer of energy sensitive resist is formed over a stack of material layers disposed on a substrate. The energy sensitive resist layer is exposed to an image of a pattern to form a photoresist mask. Thereafter, the mask pattern is transferred to one or more of the material layers of the stack using an etch process.

As the pattern dimensions are reduced, the thickness of the energy sensitive resist is correspondingly reduced in order to control pattern resolution. Such thin resist layers can be insufficient to mask underlying material layers during the pattern transfer operation due to attack by the chemical etchant. A hardmask is often used between the energy sensitive resist layer and the underlying material layers to facilitate pattern transfer because of greater resistance to the chemical etchant. As critical dimensions (CD) decrease, current hardmask materials lack the desired etch selectivity relative to underlying materials (e.g., oxides and nitrides) and are often difficult to deposit.

Therefore, there is a need in the art for an improved hardmask layers and methods for depositing improved hardmask layers.

SUMMARY

Embodiments of the present disclosure generally relate to the fabrication of integrated circuits. More particularly, the embodiments described herein provide techniques for deposition of high-density films for patterning applications. In one embodiment, a method of forming a carbon film on a substrate is provided. The method includes flowing a hydrocarbon-containing gas mixture into a process chamber having a substrate positioned on an electrostatic chuck, wherein the substrate is maintained at a temperature of about −10° C. to about 20° C. and a chamber pressure of about 0.5 mTorr to about 10 Torr, and generating a plasma by applying a first RF bias to the electrostatic chuck to deposit a diamond-like carbon film containing about 60% or greater hybridized $sp^3$ atoms on the substrate, wherein the first RF bias is provided at a power of about 1800 Watts to about 2200 Watts for a 300 mm substrate and at a frequency of about 40 MHz to about 162 MHz.

In another embodiment, the method includes flowing a hydrocarbon-containing gas mixture into a processing volume of a process chamber having a substrate positioned on an electrostatic chuck, and generating a plasma by applying a first RF bias to the electrostatic chuck and a second RF bias to an electrode disposed above and opposing the electrostatic chuck to deposit a diamond-like carbon film on the substrate, wherein first RF bias is provided at a frequency of about 13.56 MHz or below and the second RF bias is provided at a frequency of about 40 MHz or above, and the substrate is maintained at a temperature of about −10° C. to about 20° C. and a chamber pressure of about 0.5 mTorr to about 10 Torr.

In yet another embodiment, the method includes flowing a hydrocarbon-containing gas mixture into a processing volume of a process chamber having a substrate positioned on an electrostatic chuck, wherein the substrate is maintained at a chamber pressure between about 5 mTorr and about 10 mTorr, and wherein the hydrocarbon-containing gas mixture comprises acetylene ($C_2H_2$), generating a plasma at the substrate level by applying a first RF bias to the electrostatic chuck to deposit a diamond-like carbon film on the substrate, wherein the first RF bias is provided at a power of about 2000 Watts and a frequency of about 60 MHz, forming a patterned photoresist layer over the diamond-like carbon film, etching the diamond-like carbon in a pattern corresponding with the patterned photoresist layer, and depositing a material into the etched portions of the diamond-like carbon film.

BRIEF DESCRIPTION OF THE DRAWINGS

So that the manner in which the above-recited features of the present disclosure can be understood in detail, a more particular description of the embodiments, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIGS. 4A-4B depict one embodiment of a sequence for forming a diamond-like carbon layer on a film stack formed on a substrate in accordance with one or more embodiments of the present disclosure;

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The following disclosure describes techniques for deposition of diamond-like carbon films on a substrate. Embodiments described herein will be described below in reference to a PECVD process that can be carried out using any suitable thin film deposition system. Examples of suitable systems include the CENTURA® systems which may use a DXZ® processing chamber, PRECISION 5000® systems, PRODUCER® systems, PRODUCER® GT™ systems, PRODUCER® XP Precision™ systems, PRODUCER® SE™ systems, Sym3® processing chamber, and Mesa™ processing chamber, all of which are commercially available from Applied Materials, Inc., of Santa Clara, Calif. Other tools capable of performing PECVD processes may also be adapted to benefit from the embodiments described herein. In addition, any system enabling the PECVD processes described herein can be used to advantage. The apparatus description described herein is illustrative and should not be construed or interpreted as limiting the scope of the embodiments described herein.

Figure 1A:
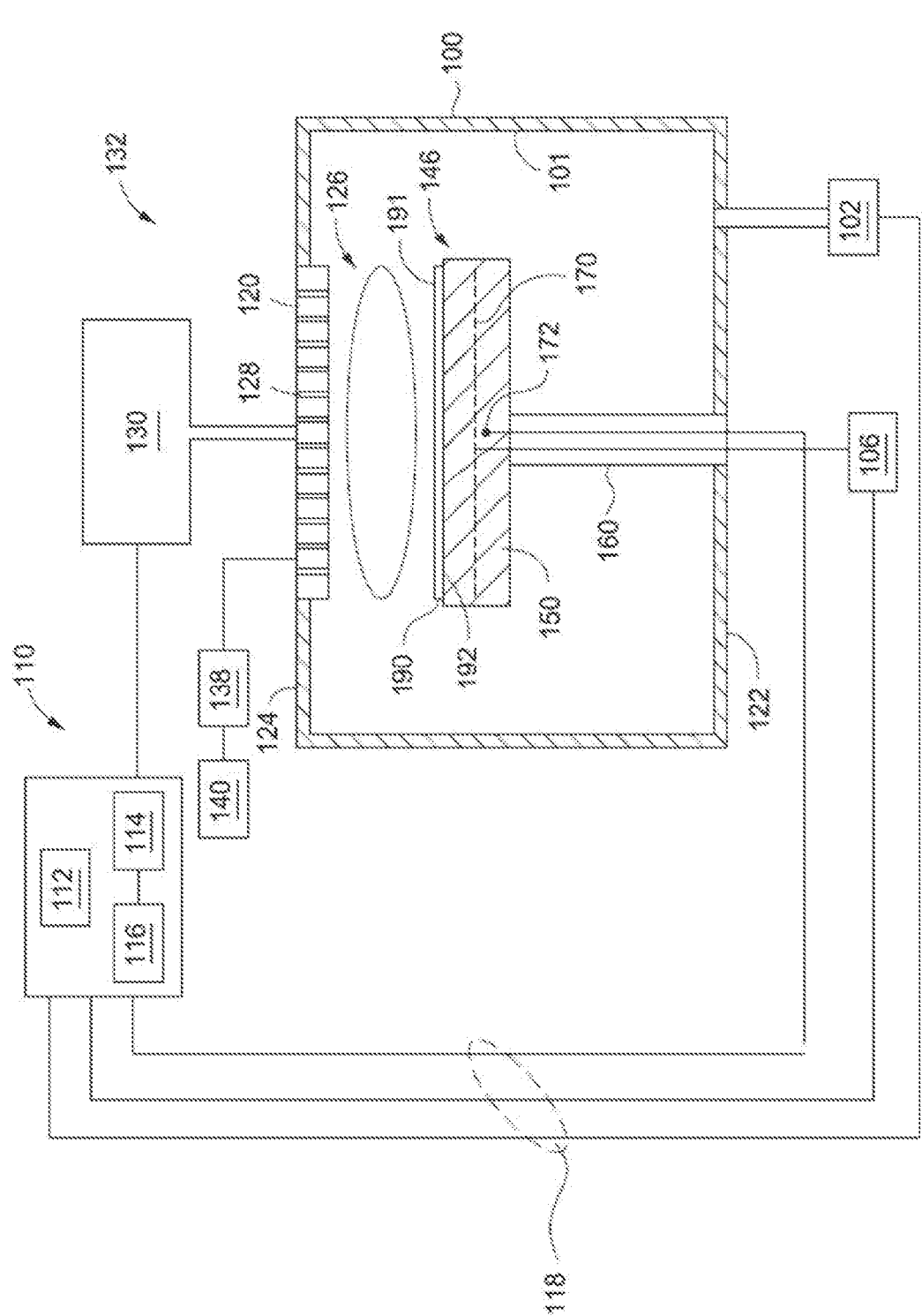
FIG. 1A depicts a schematic cross-sectional view of a deposition system that can be used for the practice of embodiments described herein.

FIG. 1A depicts a schematic illustration of a substrate processing system 132 that can be used to perform diamond-like carbon layer deposition in accordance with embodiments described herein. The substrate processing system 132 includes a process chamber 100 coupled to a gas panel 130 and a controller 110. The process chamber 100 generally includes a top wall 124, a sidewall 101 and a bottom wall 122 that define a processing volume 126. A substrate support assembly 146 is provided in the processing volume 126 of the process chamber 100. The substrate support assembly 146 generally includes an electrostatic chuck 150 supported by a stem 160. The electrostatic chuck 150 may be typically fabricated from aluminum, ceramic, and other suitable materials such as stainless steel. The electrostatic chuck 150 may be moved in a vertical direction inside the process chamber 100 using a displacement mechanism (not shown).

A vacuum pump 102 is coupled to a port formed in the bottom of the process chamber 100. The vacuum pump 102 is used to maintain a desired gas pressure in the process chamber 100. The vacuum pump 102 also evacuates post-processing gases and by-products of the process from the process chamber 100.

A gas distribution assembly 120 having a plurality of apertures 128 is disposed on the top of the process chamber 100 above the electrostatic chuck 150. The apertures 128 of the gas distribution assembly 120 are utilized to introduce process gases into the process chamber 100. The apertures 128 may have different sizes, number, distributions, shape, design, and diameters to facilitate the flow of the various process gases for different process requirements. The gas distribution assembly 120 is connected to the gas panel 130 that allows various gases to flow to the processing volume 126 during processing. A plasma is formed from the process gas mixture exiting the gas distribution assembly 120 to enhance thermal decomposition of the process gases resulting in the deposition of material on a top surface 191 of a substrate 190 positioned on the electrostatic chuck 150.

The gas distribution assembly 120 and the electrostatic chuck 150 may form a pair of spaced apart electrodes in the processing volume 126. One or more RF power source 140 provides a bias potential through a matching network 138, which is optional, to the gas distribution assembly 120 to facilitate generation of plasma between the gas distribution assembly 120 and the electrostatic chuck 150. Alternatively, the RF power source 140 and the matching network 138 may be coupled to the gas distribution assembly 120, the electrostatic chuck 150, or coupled to both the gas distribution assembly 120 and the electrostatic chuck 150, or coupled to an antenna (not shown) disposed exterior to the process chamber 100. In some embodiments, the RF power source 140 may produce power at a frequency of 350 KHz, 2 MHz, 13.56 MHz, 27 MHz, 40 MHz, 60 MHz, 100 MHz, or 162 MHz.

The controller 110 includes a central processing unit (CPU) 112, a memory 116, and a support circuit 114 utilized to control the process sequence and regulate the gas flows from the gas panel 130. The CPU 112 may be of any form of a general-purpose computer processor that may be used in an industrial setting. The software routines can be stored in the memory 116, such as random access memory, read only memory, floppy, or hard disk drive, or other form of digital storage. The support circuit 114 is coupled to the CPU 112 and may include cache, clock circuits, input/output systems, power supplies, and the like. Bi-directional communications between the controller 110 and the various components of the substrate processing system 132 are handled through numerous signal cables collectively referred to as signal buses 118, some of which are illustrated in FIG. 1A.

Figure 1B:
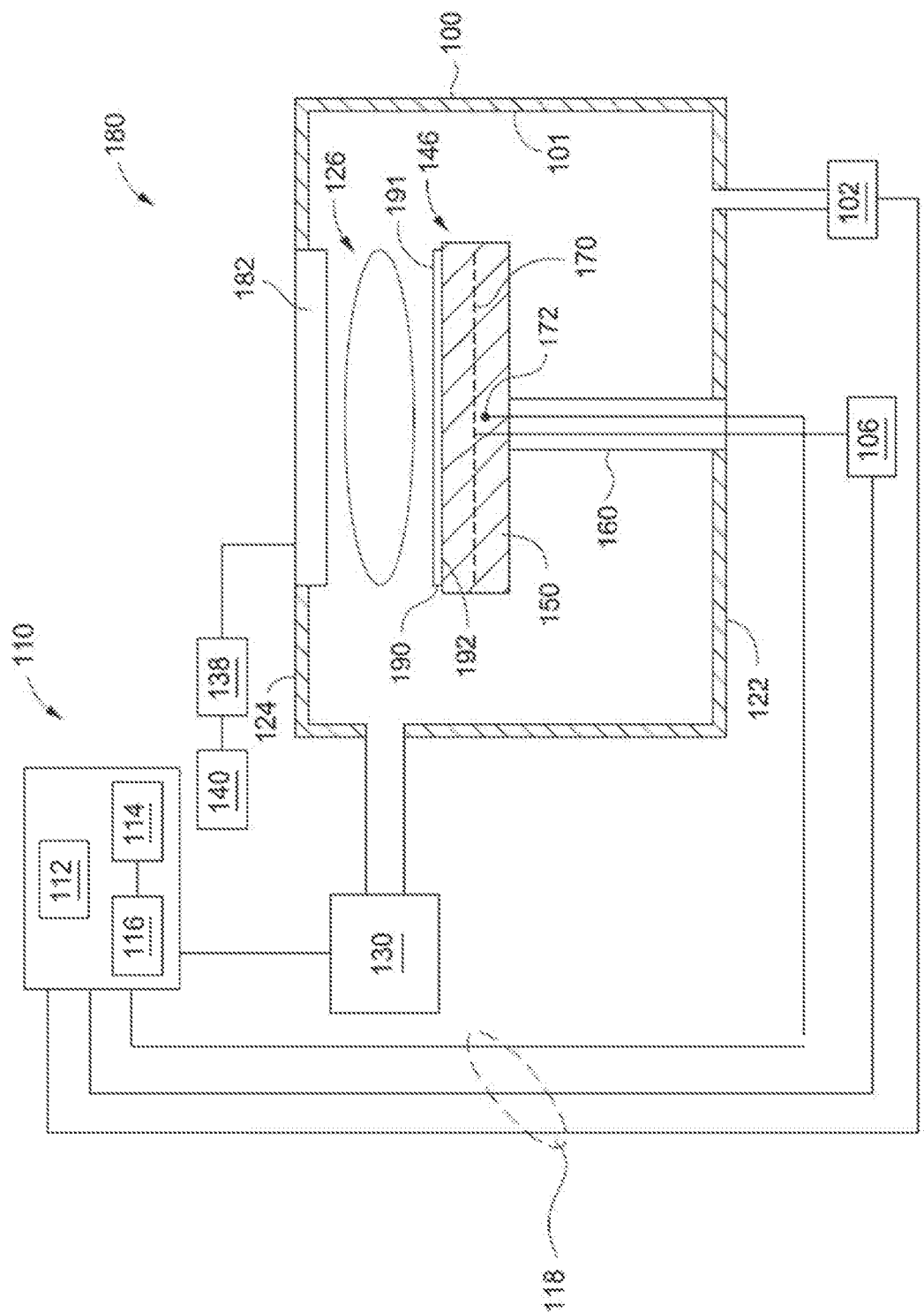
FIG. 1B depicts a schematic cross-sectional view of another deposition system that can be used for the practice of embodiments described herein.

FIG. 1B depicts a schematic cross-sectional view of another substrate processing system 180 that can be used for the practice of embodiments described herein. The substrate processing system 180 is similar to the substrate processing system 132 of FIG. 1A, except that the substrate processing system 180 is configured to radially flow processing gases from gas panel 130 across the top surface 191 of the substrate 190 via the sidewall 101. In addition, the gas distribution assembly 120 depicted in FIG. 1A is replaced with an electrode 182. The electrode 182 may be configured for secondary electron generation. In one embodiment, the electrode 182 is a silicon-containing electrode.

Figure 2:
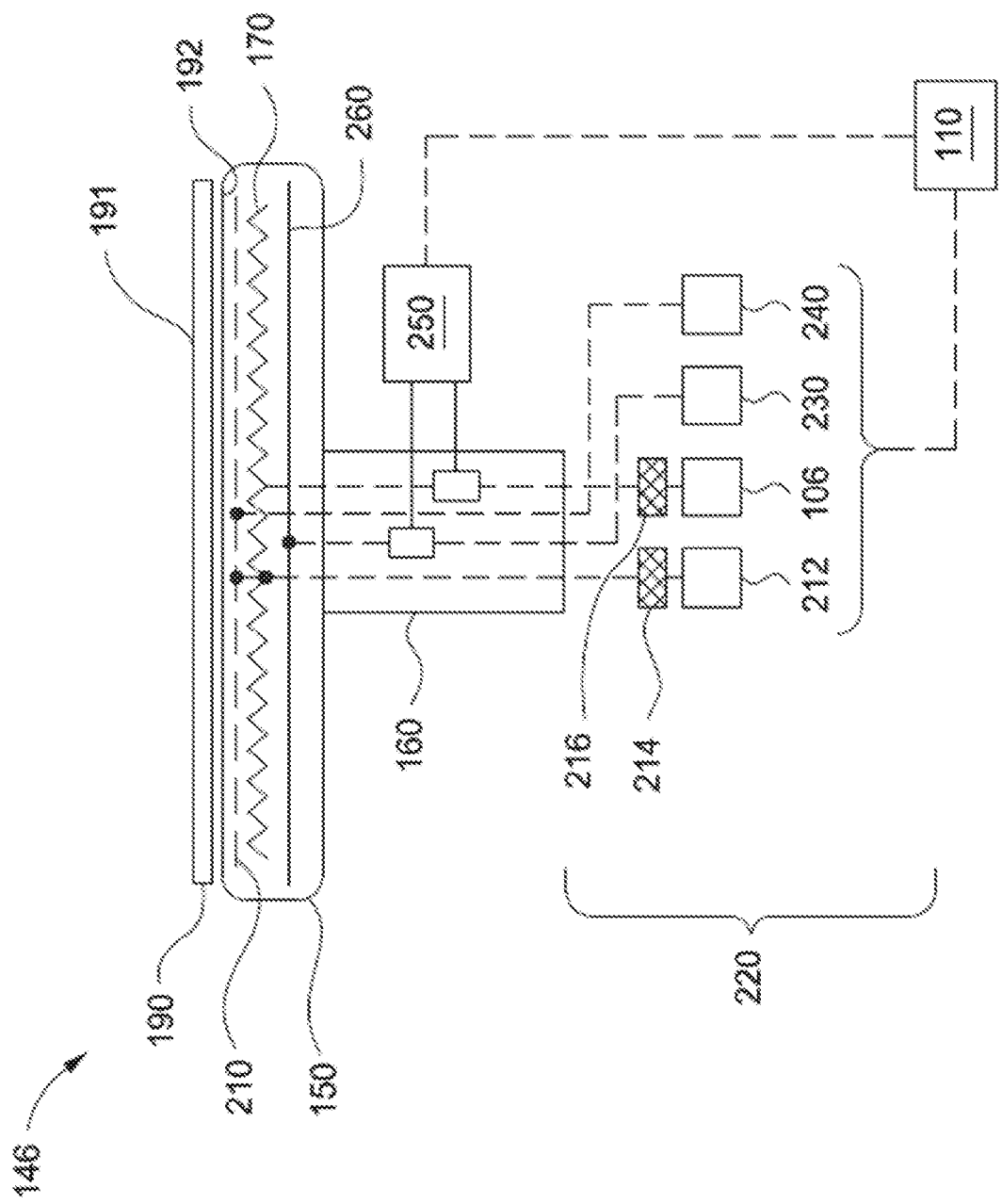
FIG. 2 depicts a schematic cross-sectional view of an electrostatic chuck that may be used in the apparatus of FIG. 1A and FIG. 1B for the practice of embodiments described herein.

FIG. 2 depicts a schematic cross-sectional view of the substrate support assembly 146 used in the processing systems of FIG. 1A and FIG. 1B that can be used for the practice of embodiments described herein. Referring to FIG. 2, the electrostatic chuck 150 may include a heater element 170 suitable for controlling the temperature of the substrate 190 supported on an upper surface 192 of the electrostatic chuck 150. The heater element 170 may be embedded in the electrostatic chuck 150. The electrostatic chuck 150 may be resistively heated by applying an electric current from a heater power source 106 to the heater element 170. The heater power source 106 may be coupled through an RF filter 216 to protect the heater power source 106 from RF energy. The electric current supplied from the heater power source 106 is regulated by the controller 110 to control the heat generated by the heater element 170, thus maintaining the substrate 190 and the electrostatic chuck 150 at a substantially constant temperature during film deposition. The supplied electric current may be adjusted to selectively control the temperature of the electrostatic chuck 150 between about −50° C. to about 350° C. during deposition of diamond-like carbon films on the substrate.

Referring to FIGS. 1A and 1B, a temperature sensor 172, such as a thermocouple, may be embedded in the electrostatic chuck 150 to monitor the temperature of the electrostatic chuck 150. The measured temperature is used by the controller 110 to control the power supplied to the heater element 170 to maintain the substrate at a desired temperature.

Referring back to FIG. 2, the electrostatic chuck 150 includes a chucking electrode 210, which may be a mesh of a conductive material. The chucking electrode 210 may be embedded in the electrostatic chuck 150. The chucking electrode 210 is coupled to a chucking power source 212 that, when energized, electrostatically clamps the substrate 190 to the upper surface 192 of the electrostatic chuck 150.

The chucking electrode 210 may be configured as a monopolar or bipolar electrode, or have another suitable arrangement. The chucking electrode 210 may be coupled through an RF filter 214 to the chucking power source 212, which provides direct current (DC) power to electrostatically secure the substrate 190 to the upper surface 192 of the electrostatic chuck 150. The RF filter 214 prevents RF power utilized to form plasma within the process chamber 100 from damaging electrical equipment. The electrostatic chuck 150 may be fabricated from a ceramic material, such as AlN or $Al_2O_3$.

A power application system 220 is coupled to the substrate support assembly 146. The power application system 220 may include the heater power source 106, the chucking power source 212, a first radio frequency (RF) power source 230, and a second RF power source 240. Embodiments of the power application system 220 may additionally include the controller 110, and a sensor device 250 that is in communication with the controller 110 and both of the first RF power source 230 and the second RF power source 240. The controller 110 may also be utilized to control the plasma from the processing gas by application of RF power from the first RF power source 230 and the second RF power source 240 in order to deposit a layer of material on the substrate 190.

As described above, the electrostatic chuck 150 includes the chucking electrode 210 that may function in one aspect to chuck the substrate 190 while also functioning as a first RF electrode. The electrostatic chuck 150 may also include a second RF electrode 260, and together with the chucking electrode 210, may apply RF power to tune the plasma. The first RF power source 230 may be coupled to the second RF electrode 260 while the second RF power source 240 may be coupled to the chucking electrode 210. A first matching network and a second matching network may be provided for the first RF power source 230 and the second RF power source 240, respectively. The second RF electrode 260 may be a solid metal plate of a conductive material or a mesh of conductive material.

The first RF power source 230 and the second RF power source 240 may produce power at the same frequency or a different frequency. In some embodiments, one or both of the first RF power source 230 and the second RF power source 240 may independently produce power at a frequency from about 350 KHz to about 162 MHz (e.g., 350 KHz, 2 MHz, 13.56 MHz, 27 MHz, 40 MHz, 60 MHz, 100 MHz, or 162 MHz). RF power from one or both of the first RF power source 230 and second RF power source 240 may be varied in order to tune the plasma.

In general, the systems described with respect to FIGS. 1A, 1B, and 2 may be used to deposit carbon films according to embodiments described herein. The carbon films (e.g., one or more carbon layers) fabricated according to the embodiments described herein are amorphous in nature and have a high $sp^3$ carbon content (e.g., diamond-like). The as-deposited diamond-like carbon layer has an extinction coefficient or k-value (K (at 633 nm)) less than 0.1, for example 0.09, a density (g/cc) of greater than 1.8 g/cc, for example approximately 2.0 g/cc or higher, approximately 2.5 g/cc or higher, such as from about 1.8 g/cc to about 2.5 g/cc, a refractive index or n-value (n (at 633 nm)) greater than 2.0, for example, approximately 2.0 to approximately 3.0, such as 2.3, a stress (MPa) less than about −100 MPa, for example from about −1000 MPa to about −100 MPa, such as about −550 MPa, and an elastic modulus (GPa) of about 150 GPa or greater, for example, from about 200 to about 400 GPa. In various embodiments of the present disclosure, the as-deposited diamond-like carbon layer may contain at least 40 percent of $sp^3$ hybridized carbon atoms or more, such as about 60 percent or more, for example about 90 percent of $sp^3$ hybridized carbon atoms. The as deposited diamond-like carbon layer may have a thickness between about 5 Å and about 20,000 Å.

The diamond-like carbon layer with characteristics above can be formed using the following exemplary deposition process parameters. The substrate temperature may range from about −50° C. to about 350° C. (e.g., from about −10° C. to about 20° C.). The chamber pressure may range from a chamber pressure of about 0.5 mTorr to about 10 Torr (e.g., about 5 mTorr to about 10 mTorr). The flow rate of the hydrocarbon-containing gas mixture may be from about 10 sccm to about 1,000 sccm (e.g., about 100 sccm to about 200 sccm). The flow rate of a dilution gas may individually range from about 50 sccm to about 5000 sccm (e.g., from about 50 sccm to about 200 sccm). Table I below illustrates exemplary deposition process parameters, which are performed on a 300 mm substrate in a deposition chamber available from Applied Materials, Inc. of Santa Clara, Calif.

TABLE I

| Deposition Parameter | Exemplary Range | Exemplary Range | Exemplary Range |
| --- | --- | --- | --- |
| Temperature (° C.) | −50-350 ° C. | 10-100 ° C. | 10-50 ° C. |
| Pressure (Torr) | 0.5 mTorr-10 Torr | 2 mTorr-50 mTorr | 2 mTorr-10 mTorr |
| First RF Power (60 MHz) | 100-3000 Watts | 2,000-3000 Watts | 2000 Watts |
| Second RF Power (2 MHz) | 200-2000 Watts | 800-1200 Watts | 1000 Watts |
| Spacing | 1000 to 15000 mils | 6000 to 12000 mils | 8000 to 12000 mils |
| $C_2H_2$ flow | 10-1000 sccm | 100-200 sccm | 150 sccm |
| He flow | 50-5000 sccm | 50-100 sccm | 100 sccm |

Figure 3:
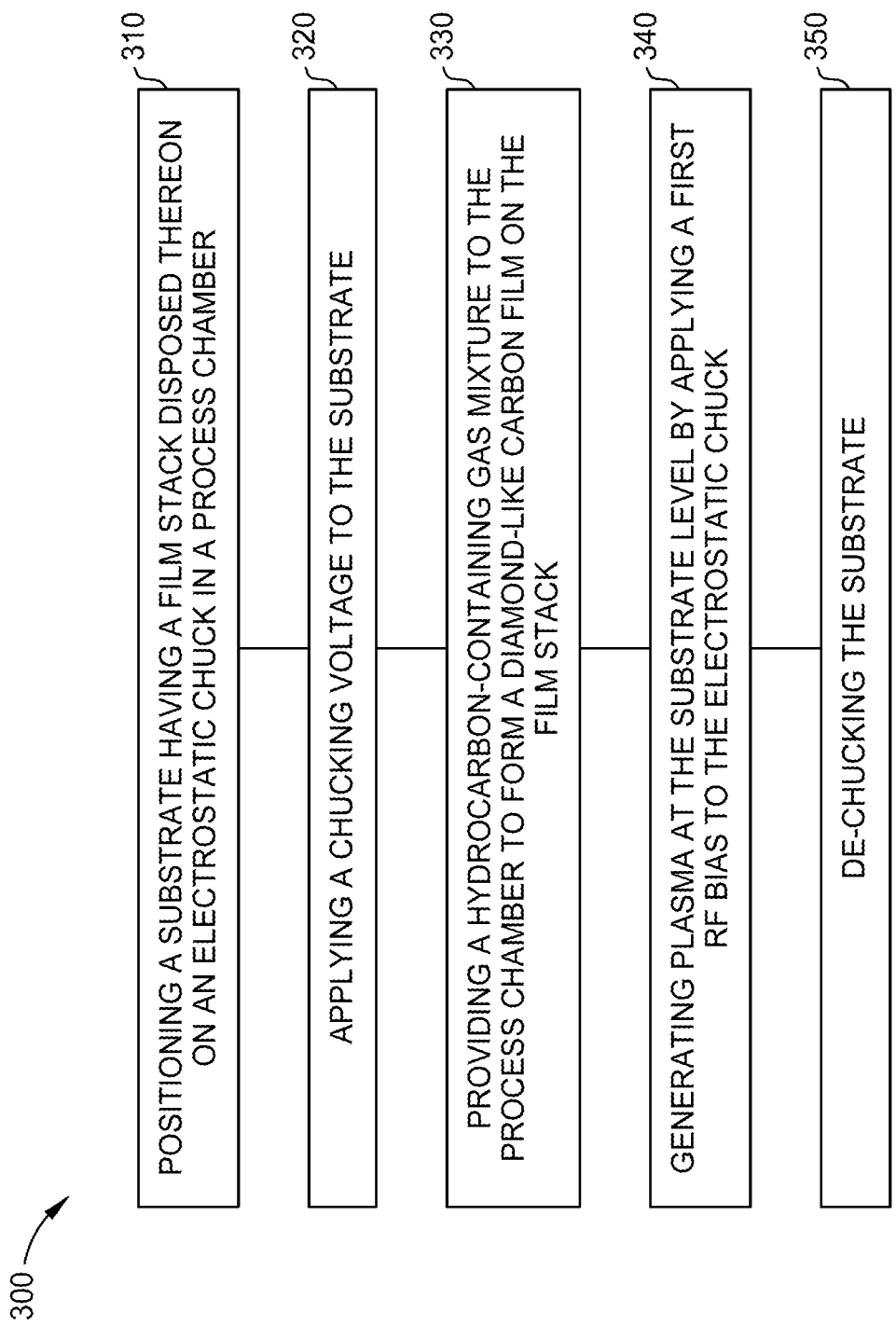
FIG. 3 depicts a flow diagram of a method for forming a diamond-like carbon layer on a film stack disposed on a substrate in accordance with one or more embodiments of the present disclosure.
Figure 4B:
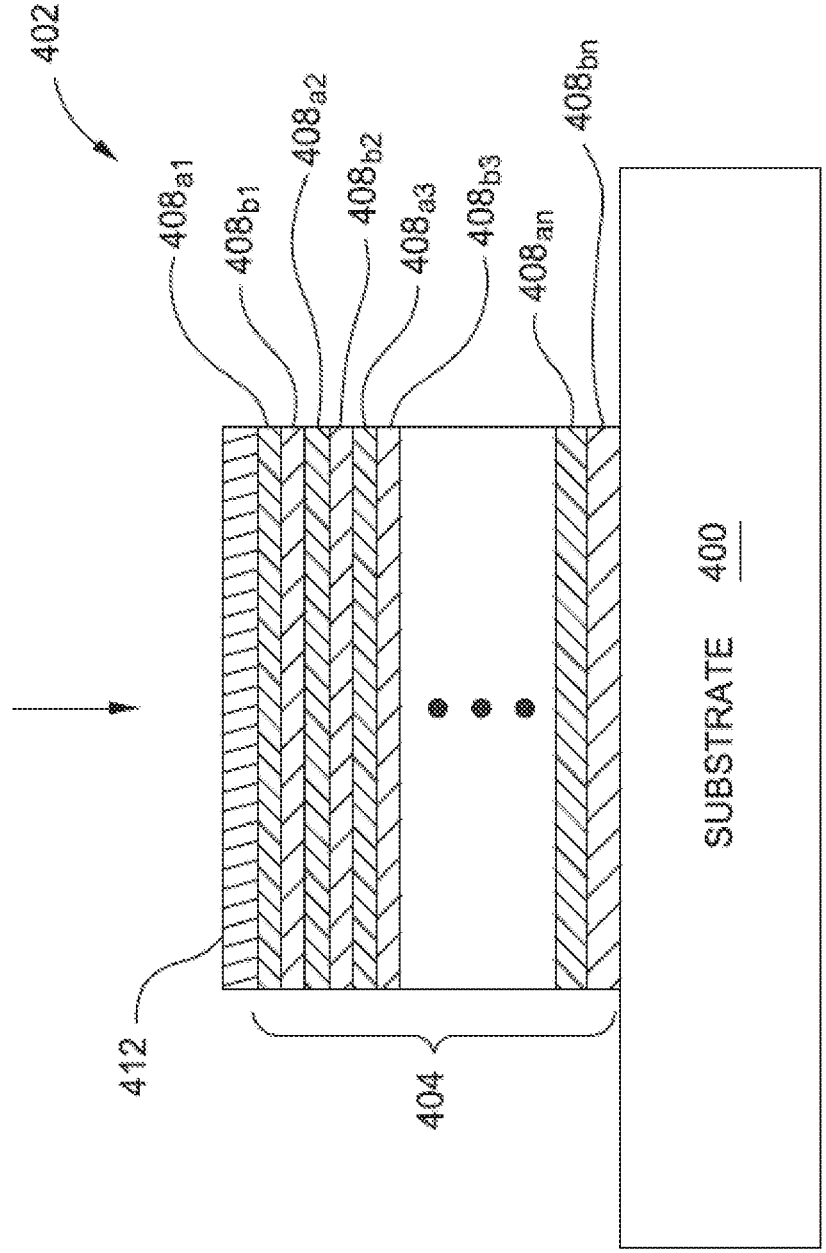

FIG. 3 depicts a flow diagram of a method 300 for forming a diamond-like carbon layer on a film stack disposed on a substrate in accordance with one embodiment of the present disclosure. The diamond-like carbon layer formed on a film stack may be utilized, for example, as a hardmask to form stair-like structures in the film stack. FIGS. 4A-4B are schematic cross-sectional views illustrating a sequence for forming a diamond-like carbon layer on a film stack disposed on a substrate according to the method 300. It should also be understood that the operations depicted in FIG. 3 may be performed simultaneously and/or in a different order than the order as depicted.

The method 300 begins at operation 310 by positioning a substrate, such as a substrate 400 depicted in FIG. 4A, into a process chamber, such as the process chamber 100 depicted in FIG. 1A or FIG. 1B. The substrate 400 may be substrate 190 depicted in FIG. 1A, FIG. 1B and FIG. 2. The substrate 400 may be positioned on an electrostatic chuck, for example, the upper surface 192 of the electrostatic chuck 150. The substrate 400 may be a silicon-based material or any suitable insulating material, conductive material, or semiconductor material as needed, having a film stack 404 disposed on the substrate 400 that may be utilized to form a structure 402, such as stair-like structures, in the film stack 404.

As shown in the exemplary embodiment depicted in FIG. 4A, the substrate 400 may have a substantially planar surface, an uneven surface, or a substantially planar surface having a structure formed thereon. The film stack 404 is formed on the substrate 400. In one embodiment, the film stack 404 may be utilized to form a gate structure, a contact structure or an interconnection structure in a front end or back end process. The method 300 may be performed on the film stack 404 to form the stair-like structures therein used in a memory structure, such as NAND structure. In one embodiment, the substrate 400 may be a material such as crystalline silicon (e.g., Si<100> or Si<111>), silicon oxide, strained silicon, silicon germanium, doped or undoped polysilicon, doped or undoped silicon substrates and patterned or non-patterned substrates silicon on insulator (SOI), carbon doped silicon oxides, silicon nitride, doped silicon, germanium, gallium arsenide, glass, sapphire. The substrate 400 may have various dimensions, such as 200 mm, 300 mm, and 450 mm or other diameter substrates, as well as, rectangular or square panels. Unless otherwise noted, embodiments and examples described herein are conducted on substrates with a 200 mm diameter, a 300 mm diameter, or a 450 mm diameter. In the embodiment wherein a SOI structure is utilized for the substrate 400, the substrate 400 may include a buried dielectric layer disposed on a silicon crystalline substrate. In the embodiment depicted herein, the substrate 400 may be a crystalline silicon substrate.

In one embodiment, the film stack 404 disposed on the substrate 400 may have a number of vertically stacked layers. The film stack 404 may comprise pairs including a first layer (shown as $408a_1$, $408a_2$, $408a_3$, ..., $408a_n$) and a second layer (shown as $408b_1$, $408b_2$, $408b_3$, ..., $408b_n$) repeatedly formed in the film stack 404. The pairs includes alternating first layer (shown as $408a_1$, $408a_2$, $408a_3$, ..., $408a_n$) and second layer (shown as $408b_1$, $408b_2$, $408b_3$, ..., $408b_n$) repeatedly formed until desired numbers of pairs of the first layers and the second layers are reached.

The film stack 404 may be a part of a semiconductor chip, such as a three-dimensional memory chip. Although three repeating layers of first layers (shown as $408a_1$, $408a_2$, $408a_3$, ..., $408a_n$) and second layers (shown as $408b_1$, $408b_2$, $408b_3$, ..., $408b_n$) are shown in FIGS. 4A-4B, it is noted that any desired number of repeating pairs of the first and the second layers may be utilized as needed.

In one embodiment, the film stack 404 may be utilized to form multiple gate structures for a three-dimensional memory chip. The first layers $408a_1$, $408a_2$, $408a_3$, ..., $408a_n$ formed in the film stack 404 may be a first dielectric layer and the second layers $408b_1$, $408b_2$, $408b_3$, ..., $408b_n$ may be a second dielectric layer. Suitable dielectric layers may be utilized to form the first layers $408a_1$, $408a_2$, $408a_3$, ..., $408a_n$ and the second layer $408b_1$, $408b_2$, $408b_3$, ..., $408b_n$ include silicon oxide, silicon nitride, silicon oxynitride, silicon carbide, silicon oxycarbide, titanium nitride, composite of oxide and nitride, at least one or more oxide layers sandwiching a nitride layer, and combinations thereof. In some embodiments, the dielectric layers may be a high-k material having a dielectric constant greater than 4. Suitable examples of the high-k materials include hafnium dioxide ($HfO_2$), zirconium dioxide ($ZrO_2$), hafnium silicon oxide ($HfSiO_2$), hafnium aluminum oxide (HfAlO), zirconium silicon oxide ($ZrSiO_2$), tantalum dioxide ($TaO_2$), aluminum oxide, aluminum doped hafnium dioxide, bismuth strontium titanium (BST), and platinum zirconium titanium (PZT), among others.

In one particular example, the first layers $408a_1$, $408a_2$, $408a_3$, ..., $408a_n$ are silicon oxide layers and the second layers $408b_1$, $408b_2$, $408b_3$, ..., $408b_n$ are silicon nitride layers or polysilicon layers disposed on the first layers $408a_1$, $408a_2$, $408a_3$, ..., $408a_n$. In one embodiment, the thickness of first layers $408a_1$, $408a_2$, $408a_3$, ..., $408a_n$ may be controlled at between about 50 Å and about 1000 Å, such as about 500 Å, and the thickness of the each second layers $408b_1$, $408b_2$, $408b_3$, ..., $408b_n$ may be controlled at between about 50 Å and about 1000 Å, such as about 500 Å. The film stack 404 may have a total thickness between about 100 Å and about 2000 Å and may vary as technology advances.

It is noted that the diamond-like carbon layer may be formed on any surfaces or any portion of the substrate 400 with or without the film stack 404 present on the substrate 400.

At operation 320, a chucking voltage is applied to the electrostatic chuck to clamp the substrate 400 to the electrostatic chuck. An electrical bias is provided to the substrate 400 via chucking electrode 210. The chucking electrode 210 may be in electronic communication with the chucking power source 212 that supplies a biasing voltage to the chucking electrode 210. In one embodiment, the chucking voltage is between about 10 volts and about 3000 volts.

During operation 320, the process pressure in the processing volume may be maintained at about 0.1 mTorr to about 10 Torr (e.g., about 0.5 mTorr to about 15 mTorr), and the processing temperature and/or substrate temperature may be maintained at about −50° C. to about 350° C. (e.g., about −10° C. to about 20° C.).

At operation 330, a hydrocarbon-containing gas mixture is flowed into the processing volume 126. The hydrocarbon-containing gas mixture may be flowed from the gas panel 130 into the processing volume 126 either through the gas distribution assembly 120 or via the sidewall 101. The hydrocarbon-containing gas mixture may include at least one hydrocarbon compound. The hydrocarbon-containing gas mixture may further include an inert gas, a dilution gas, or any combinations thereof. In some embodiments, the chucking voltage supplied during operation 320 is maintained during operation 330. In some embodiments, the process conditions established during operation 320 and are maintained during operation 330.

In one embodiment, the hydrocarbon compound is a gaseous hydrocarbon. In one embodiment, the hydrocarbon compound has a general formula $C_xH_y$, where x has a range of between 1 and 20 and y has a range of between 1 and 20. Suitable hydrocarbon compounds include, for example, $C_2H_2$, $C_3H_6$, $CH_4$, $C_4H_8$, 1,3-dimethyladamantane, bicyclo [2.2.1]hepta-2,5-diene (2,5-Norbornadiene), adamantine ($C_{10}H_{16}$), norbornene ($C_7H_{10}$), or combinations thereof.

In some embodiments, the hydrocarbon-containing gas mixture further comprises one or more dilution gases. Suitable dilution gases may include, but are not limited to, helium (He), argon (Ar), xenon (Xe), hydrogen ($H_2$), nitrogen ($N_2$), ammonia ($NH_3$), or any combinations thereof. In one embodiment, the dilution gas includes a combination of Ar, He, and $N_2$. In one embodiment, the dilution gas includes a combination of Ar, He, and $H_2$.

In some embodiments, the hydrocarbon-containing gas mixture further comprises an inert gas. In some embodiments, an inert gas, such as argon (Ar) and/or helium (He) may be supplied with the hydrocarbon-containing gas mixture into the processing volume 126. Other inert gases, such as nitrogen ($N_2$) and nitric oxide (NO), may also be used to control the density and deposition rate of the diamond-like carbon layer.

At operation 340, a plasma is generated at the substrate level to form the diamond-like carbon film on the film stack as shown in FIG. 4B. Plasma may be generated by applying a first RF bias to the electrostatic chuck. The first RF bias may be from about 10 Watts and about 3000 Watts at a frequency of from about 350 KHz to about 162 MHz (e.g., 350 KHz, 2 MHz, 13.56 MHz, 27 MHz, 40 MHz, 60 MHz, 100 MHz, or 162 MHz). In one embodiment, the first RF bias is provided at a power between about 1500 Watts and about 2500 Watts (e.g., 1800-2200 Watts) and at a frequency of about 40 MHz or above. In one embodiment, the first RF bias is provided to the electrostatic chuck 150 via the second RF electrode 260. The second RF electrode 260 may be in electronic communication with the first RF power source 230 that supplies a biasing voltage to the second RF electrode 260. The first RF power source 230 may produce power at a frequency of from about 350 KHz to about 100 MHz (e.g., 350 KHz, 2 MHz, 13.56 MHz, 27 MHz, 40 MHz, 60 MHz, or 100 MHz).

In some embodiments, operation 340 further comprises applying a second RF bias to the electrostatic chuck to independently control ion density and ion energy to modulate film stress. The second RF bias may be from about 10 Watts and about 3000 Watts and at a frequency of from about 350 KHz to about 100 MHz (e.g., 350 KHz, 2 MHz, 13.56 MHz, 27 MHz, 40 MHz, 60 MHz, or 100 MHz). In one embodiment, the second RF bias is provided at a power between about 800 Watts and about 1200 Watts and at a frequency of about 13.56 MHz or below, for example about 2 MHz. In one embodiment, the second RF bias is provided to the substrate 400 via the chucking electrode 210. The chucking electrode 210 may be in electronic communication with second RF power source 240 that supplies a biasing voltage to the chucking electrode 210. In one embodiment, the second RF bias is provided at a power between about 10 Watts and about 3000 Watts. In one embodiment, the second RF bias is provided at a power between about 800 Watts and about 1200 Watts. In one embodiment, the chucking voltage supplied in operation 320 is maintained during operation 340.

In some embodiments, which can be combined with any other embodiments of this disclosure, during operation 340, the first RF bias is provided to the substrate 400 via the chucking electrode 210 and the second RF bias may be provided to the substrate 400 via the second RF electrode 260.

In some embodiments, which can be combined with any other embodiments of this disclosure, during operation 340, the first RF bias is provided to the gas distribution assembly 120 or the electrode 182, and the second RF bias may be provided to the substrate 400 via the second RF electrode 260 or the chucking electrode 210. In such a case, the first RF bias applying to the gas distribution assembly 120 or the electrode 182 can have a high frequency, and the second RF bias applying to second RF electrode 260 or the chucking electrode 210 can have a low frequency.

Various combinations of power level and frequency can be used by the first RF bias and the second RF bias. In some embodiments, the first RF bias can be about 2000 Watts at about 40 MHz, 60 MHz, or 162 MHz, and the second RF bias can be about 1000 Watts at 350 KHz. In some embodiments, the first RF bias can be about 2000 Watts at 40 MHz, 60 MHz, or 162 MHz, and the second RF bias can be about 1000 Watts at 2 MHz. In some embodiments, the first RF bias can be about 2000 Watts at about 40 MHz, 60 MHz, or 162 MHz, and the second RF bias can be about 1000 Watts at 13.56 MHz.

In some further embodiments, which can be combined with any other embodiments of this disclosure, during operation 340, the first RF bias is provided to the substrate 400 via the chucking electrode 210, the second RF bias may be provided to the substrate 400 via the second RF electrode 260, and a third RF bias may be provided to the gas distribution assembly 120 or the electrode 182. In such a case, the first RF bias and the second RF bias can be any combinations of frequencies and power discussed in this disclosure, and the third RF bias may be configured to have power and frequency identical to that of the first or second RF bias discussed herein.

In some embodiments, after the diamond-like carbon layer 412 is formed on the substrate during operation 340, the diamond-like carbon layer 412 is exposed to hydrogen radicals. In some embodiments, the diamond-like carbon layer is exposed to hydrogen radicals during the deposition process of operation 340. In some embodiments, the hydrogen radicals are formed in an RPS and delivered to the processing region. Not to be bound by theory, but it is believed that exposing the diamond-like carbon layer to hydrogen radicals leads to selective etching of $sp^2$ hybridized carbon atoms thus increasing the $sp^3$ hybridized carbon atom fraction of the film, thus increasing the etch selectivity.

At operation 350, after the diamond-like carbon layer 412 is formed on the substrate, the substrate is de-chucked. During operation 350, the chucking voltage is turned-off. The reactive gases are turned-off and optionally purged from the processing chamber. In one embodiment, during operation 350 RF power is reduced (e.g., ~200 W). Once the substrate is de-chucked from the electrostatic chuck, the remaining gases are purged from the processing chamber. The processing chamber is pumped down and the substrate is moved up on the lift pins and transferred out of the process chamber.

After the diamond-like carbon layer 412 is formed on the substrate, the diamond-like carbon layer 412 may be utilized in an etching process as a patterning mask to form a three-dimensional structure, such as a stair like structure. The diamond-like carbon layer 412 may be patterned using a standard photoresist patterning techniques.

The following non-limiting examples are provided to further illustrate embodiments described herein. However, the examples are not intended to be all inclusive and are not intended to limit the scope of the embodiments described herein. In one embodiment, a low stress, high-density diamond-like carbon film of the present disclosure was fabricated by flowing 150 sccm $C_2H_2$ and 100 sccm He as process gases at a temperature of 10° C., applying 2000 Watts RF (60 MHz) power through the substrate pedestal (electrostatic chuck) in a CVD reactor with Ar and/or He as diluting gas. Comparison between the resultant diamond-like carbon film, amorphous carbon reference films and diamond-like carbon films formed by PVD are illustrated in Table II below.

TABLE II

| Film Type | Amorphous Carbon Film Reference | PVD Diamond-Like Carbon Film Reference | PECVD Diamond-like carbon film |
|---|---|---|---|
| Density (g/cc) | 1.75 | 2.52 | 1.83 |
| Stress (MPa) | −50 | −350 | −600 |
| n @ 633 nm | 2.07 | >2.3 | 2.37 |
| k @ 633 nm | 0.63 | >0.5 | 0.09 |
| sp$^3$ % | <10% | ~50% | ~60% |
| Modulus/Hardness (GPa) | 53/5.8 | 231/19 | 180/20 |

Thus, methods and apparatus for forming a high transparency, diamond-like carbon hardmask layer that may be utilized to form stair-like structures for manufacturing three-dimensional stacking of semiconductor devices are provided. By utilization of the diamond-like hardmask layer with desired robust film properties and etching selectivity, an improved dimension and profile control of the resultant structures formed in a film stack may be obtained and the electrical performance of the chip devices may be enhanced in applications for three-dimensional stacking of semiconductor devices.

While the foregoing is directed to embodiments of the present disclosure, other and further embodiments of the disclosure may be devised without departing from the basic scope thereof, and the scope thereof is determined by the claims that follow.

The invention claimed is:

1. A method of forming a carbon film on a substrate, comprising:
   flowing a hydrocarbon-containing gas mixture into a process chamber having the substrate positioned on an electrostatic chuck comprising a first radio frequency (RF) electrode and a second RF electrode disposed within the electrostatic chuck, wherein the substrate is maintained at a temperature of −10° C. to 20° C. and a chamber pressure of 0.5 mTorr to 10 Torr; and
   generating a plasma by applying a first RF bias to the first RF electrode of the electrostatic chuck to deposit a diamond-like carbon film containing 60% or greater hybridized sp$^3$ atoms on the substrate, wherein the first RF bias is provided at a power of 1800 Watts to 2200 Watts and at a frequency of 40 MHz to 162 MHz, wherein a voltage of 10 volts to 3000 volts is provided to the electrostatic chuck.

2. The method of claim 1, wherein generating the plasma further comprises applying a second RF bias to the second RF electrode of the electrostatic chuck.

3. The method of claim 2, wherein the second RF bias is provided at a power of 800 Watts to 1200 Watts and at a frequency of 350 KHz to 13.56 MHz.

4. The method of claim 2, wherein the first RF bias is provided at the power of 2000 Watts and at the frequency of 60 MHz, and the second RF bias is provided at a power of 1000 Watts and a frequency of 2 MHz.

5. The method of claim 1, wherein the substrate is maintained at the temperature of 10° C.

6. The method of claim 1, wherein the hydrocarbon-containing gas mixture includes a hydrocarbon precursor comprising $C_2H_2$, $C_3H_6$, $CH_4$, $C_4H_8$, 1,3-dimethyladamantane, bicyclo[2.2.1]hepta-2,5-diene (2,5-Norbornadiene), adamantine ($C_{10}H_{16}$), norbornene ($C_7H_{10}$), or any combinations thereof.

7. The method of claim 1, wherein the hydrocarbon-containing gas mixture further includes a dilution gas comprising He, Ar, Xe, $N_2$, $H_2$, or any combinations thereof.

8. The method of claim 1, wherein the hydrocarbon-containing gas mixture is flowed into the process chamber through a gas panel disposed at a sidewall of the process chamber.

9. A method of forming a carbon film on a semiconductor substrate, comprising:
   flowing a hydrocarbon-containing gas and dilution gas mixture into a process chamber having the semiconductor substrate positioned on an electrostatic chuck, wherein a volumetric ratio of dilution gas to hydrocarbon-containing gas is 1:4 or greater; and
   generating a plasma by applying a first radio frequency (RF) bias to a first electrode disposed in the electrostatic chuck and a second RF bias to a second electrode disposed in the electrostatic chuck to deposit a diamond-like carbon film on the semiconductor substrate, wherein first RF bias is provided at a frequency of 13.56 MHz or below and the second RF bias is provided at a frequency of 40 MHz or above, and the semiconductor substrate is maintained at a temperature of −10° C. to 20° C. and a chamber pressure of 0.5 mTorr to 10 Torr.

10. The method of claim 9, wherein the first RF bias is provided at the frequency of 2 MHz and a power of about 800 Watts to 1200 Watts.

11. The method of claim 9, wherein the second RF bias is provided at the frequency of 60 MHz and a power of 1500 Watts to 2500 Watts.

12. The method of claim 9, wherein the hydrocarbon-containing gas comprises $C_2H_2$, $C_3H_6$, $CH_4$, $C_4H_8$, 1,3-dimethyladamantane, bicyclo[2.2.1]hepta-2,5-diene (2,5-Norbornadiene), adamantine ($C_{10}H_{16}$), norbornene ($C_7H_{10}$), or any combinations thereof.

13. The method of claim 9, wherein the dilution gas comprises He, Ar, Xe, $N_2$, $H_2$, or any combinations thereof.

14. The method of claim 9, wherein generating the plasma further comprises applying a third RF bias to a third electrode disposed above and opposing the electrostatic chuck.

15. The method of claim 14, wherein the third RF bias is provided at a power of 10 Watts and 3000 Watts and at a frequency of from 350 KHz to 162 MHz.

16. A method of processing a substrate, comprising:
   flowing a hydrocarbon-containing gas mixture into a processing volume of a process chamber having the substrate positioned on an electrostatic chuck, wherein the substrate is maintained at a chamber pressure between 5 mTorr and 10 mTorr, and wherein the hydrocarbon-containing gas mixture comprises acetylene ($C_2H_2$), wherein the substrate comprises a film stack having a first dielectric layer and a second dielectric layer disposed over the first dielectric layer;
   generating a plasma by applying a first radio frequency (RF) bias to the electrostatic chuck to deposit a diamond-like carbon film on the substrate, wherein the first RF bias is provided at a power of 2000 Watts to 3000 Watts and a frequency of 40 MHz to about 60 MHz, wherein an elastic modulus of the diamond-like carbon film is 200 GPa to 400 GPa;
   forming a patterned photoresist layer over the diamond-like carbon film;

etching the diamond-like carbon in a pattern corresponding with the patterned photoresist layer resulting in etched portions; and depositing a material into the etched portions of the diamond-like carbon film.

17. The method of claim 16, wherein generating a plasma further comprises applying a second RF bias to the electrostatic chuck, wherein the second RF bias is provided at a power of 1000 Watts and a frequency of 2 MHz.

18. The method of claim 16, wherein the diamond-like carbon film is used as an underlayer in an extreme ultraviolet ("EUV") lithography process.

19. The method of claim 16, wherein the hydrocarbon-containing gas mixture further includes a dilution gas comprising He, Ar, Xe, $N_2$, $H_2$, or any combinations thereof.

20. The method of claim 19, wherein the hydrocarbon-containing gas mixture is flowed into the process chamber through a gas panel disposed at a sidewall of the process chamber.

\* \* \* \* \*